(12) United States Patent
Liu

(10) Patent No.: US 6,324,048 B1
(45) Date of Patent: Nov. 27, 2001

(54) ULTRA-SMALL CAPACITOR ARRAY

(75) Inventor: Donghang Liu, Myrtle Beach, SC (US)

(73) Assignee: AVX Corporation, Myrtle Beach, SC (US)

(*) Notice: Subject to any disclaimer, the term of this patent is extended or adjusted under 35 U.S.C. 154(b) by 0 days.

(21) Appl. No.: 09/034,754

(22) Filed: Mar. 4, 1998

(51) Int. Cl.$^7$ ............................. H01G 4/228; H01G 4/00
(52) U.S. Cl. ............................ 361/306.1; 361/306.3; 361/311; 361/301.3
(58) Field of Search ........................ 361/301.1, 301.3, 361/301.4, 303, 305, 306.1, 306.3, 308.1, 308.2, 309–313, 320–321.5; 257/295–296, 303, 306, 310

(56) References Cited

U.S. PATENT DOCUMENTS

| | | |
|---|---|---|
| 3,268,744 | 8/1966 | Kaiser et al. . |
| 3,273,033 | 9/1966 | Rossmeisl . |
| 3,600,652 * | 8/1971 | Riley ................................. 361/321.5 |
| 3,778,689 | 12/1973 | Bodway . |
| 3,821,617 * | 6/1974 | Shelby et al. ..................... 361/303 |
| 4,251,326 | 2/1981 | Arcidiacono et al. . |
| 4,410,867 | 10/1983 | Arcidiacono et al. . |
| 4,439,813 | 3/1984 | Dougherty et al. . |
| 4,788,524 | 11/1988 | Ozaki . |
| 4,801,469 | 1/1989 | Norwood . |
| 4,933,208 | 6/1990 | Dorinski . |
| 4,971,924 | 11/1990 | Tigelaar et al. . |
| 5,065,220 | 11/1991 | Paterson et al. . |
| 5,079,670 | 1/1992 | Tigelaar et al. . |
| 5,108,941 | 4/1992 | Paterson et al. . |
| 5,206,788 * | 4/1993 | Larson et al. ..................... 361/313 |
| 5,288,660 | 2/1994 | Hua et al. . |
| 5,370,766 | 12/1994 | Desaigoudar et al. . |
| 5,420,745 | 5/1995 | Hidaka et al. . |
| 5,450,263 | 9/1995 | Desaigoudar et al. . |
| 5,457,598 | 10/1995 | Radford et al. . |
| 5,466,887 | 11/1995 | Hasegawa . |
| 5,569,880 | 10/1996 | Galvagni et al. . |
| 5,600,532 | 2/1997 | Michiya et al. . |
| 5,625,529 | 4/1997 | Lee et al. . |
| 5,822,175 | 10/1998 | Azuma . |
| 5,880,925 * | 3/1999 | Dupre et al. ..................... 361/303 |

FOREIGN PATENT DOCUMENTS 7-263277 * 10/1995 (JP) .

OTHER PUBLICATIONS

U.S. application No. 09/293,817, Kennedy et al., filed Apr. 16, 1999.

Strandjord, Rogers, Ida, DeVellis, Shiau, Moyer, Scheck & Garrou, "Photosensitive Benzocyclobutene for Stress–Buffer and Passivation Applications (One Mask Manufacturing Process)", in *1997 Electronic Components and Technology Conference*, 1997.

Liu and Mevissen, "Thick Layer Deposition of Lead Perovskites Using Diol–Based Chemical Solution Approach," in *Integrated Ferroelectrics*, 1997, vol. 18, pp. 263–274.

* cited by examiner

Primary Examiner—Anthony Dinkins
(74) Attorney, Agent, or Firm—Dority & Manning, P.A.

(57) ABSTRACT

An electronic device has a plurality of capacitors in an ultra-small integrated package. The device has a plurality of terminal structures on one terminal side of the package to permit inverted mounting to a printed circuit board. The terminals are widely spaced, with the individual capacitors being located entirely in between. The device is produced on a suitable substrate using thin film manufacturing techniques. A lead-based dielectric having a high dielectric constant is preferably utilized for each capacitor to provide a relatively high-capacitance value in a relatively small plate area.

13 Claims, 8 Drawing Sheets

ULTRA-SMALL CAPACITOR ARRAY

BACKGROUND OF THE INVENTION

The present invention relates generally to small electronic components adapted to be mounted on a larger circuit board. More particularly, the invention relates to an ultra-small capacitor array for use in a variety of applications.

For some time, the design of various electronic components has been driven by a general industry trend toward miniaturization. In this regard, a need exists for ever smaller electronic components having exceptional operating characteristics. For example, some applications may require a very small capacitor array wherein each of the individual capacitors has a relatively large capacitance value.

Consider a device specifying an exterior size of no greater than 0.50 mils and 0.55 mils in respective width and length dimensions, while providing an array of three capacitors each having a capacitance of at least 560 picofarads. It is very difficult in such a small component to provide multiple capacitors having the desired capacitance value. Adequate termination structures for connection of the device to external circuitry must also be provided.

SUMMARY OF THE INVENTION

The present invention recognizes various disadvantages of prior art constructions and methods. Accordingly, it is an object of the present invention to provide a novel electronic component.

It is a further object of the present invention to provide a novel capacitor array of ultra-small dimensions.

It is a further object of the present invention to provide a novel capacitor array wherein each of the individual capacitors has a relatively large capacitance value.

It is a still further object of the present invention to provide a novel thin-film capacitor device.

It is an additional object of the present invention to provide a method of manufacturing a thin film capacitor array.

Some of these objects are achieved by a miniature capacitor device for inverted mounting to a predetermined surface. The device comprises a substrate, such as silicon, glass or $Al_2O_3$. A first conductive layer is disposed on the substrate. The first conductive layer defines at least one first capacitor plate and a first terminal structure adjacent thereto. In addition, a dielectric layer is disposed on the first capacitor plate. A second conductive layer defines at least one second capacitor plate and a second terminal structure adjacent thereto. The second capacitor plate is disposed on the dielectric layer in opposition to the first capacitor plate. It will often be desirable to also provide an encapsulate material disposed over layers on the substrate. The encapsulate material is defined to expose the first and second terminal structures.

The dielectric material may preferably have a dielectric constant of at least about 100. Often, the dielectric constant may exceed 500, with a dielectric constant of 1100 being utilized in some exemplary embodiments. The dielectric material may comprises a lead-based dielectric material such as a PZT material. Such a dielectric layer may have a thickness of no greater than approximately 1.0 μm.

The first conductive layer may comprise at least three first capacitor plates. In this case, the second conductive layer comprises at least three second capacitor plates respectively opposed thereto. The second conductive layer may further define a respective second terminal structure disposed adjacent to each of the second capacitor plates.

Other objects of the invention are achieved by a miniature capacitor array having a plurality of capacitor devices in a single package. The device comprises a substrate having a first conductive layer disposed thereon. The first conductive layer defines a plurality of first capacitor plates. A dielectric layer is disposed on the plurality of first capacitor plates. A second conductive layer defines a plurality of second capacitor plates disposed on the dielectric layer in opposition to respective of the first capacitor plates. The second conductive layer further defines respective terminal structures adjacent to each of the second capacitor plates. It will often be desirable to provide an encapsulate material disposed over layers on the substrate. The encapsulate material is defined to expose the terminal structures.

The first conductive layer may comprise at least three first capacitor plates. The second conductive layer may comprise at least three second capacitor plates respectively opposed thereto.

In some exemplary embodiments, the top surface of the substrate has an area of no greater than approximately 2750 square mils. Each of the capacitor devices may be advantageously located between a respective pair of terminal structures. The capacitor devices may have a relatively large capacitance value.

The first conductive layer may be a continuous conductive layer in which the plurality of first capacitor plates comprise integral portions thereof. The first conductive layer may define a common terminal structure as a further integral portion thereof.

Further objects of the present invention are achieved by an electronic device comprising at least one thin film capacitor arranged on a substrate. The capacitor of the electronic device has a capacitance of approximately equal to or greater than 14 nanofarad/mil$^2$.

In some exemplary embodiments, the thin film capacitor is located between terminals configured for connection of the electronic device to external circuitry. The capacitor may have a dielectric layer with a thickness of no greater than approximately 1.0 μm. For example, the dielectric layer may have a thickness of approximately 0.8 to 1.0 μm. A PZT dielectric material applied by a sol-gel process may be utilized.

Other objects of the invention are achieved by a method of manufacturing a thin film capacitor array. As an initial step, the method involves providing a generally planar substrate. A first conductive layer is applied to the substrate and formed so as to define a plurality of first capacitor plates. A dielectric layer is then applied to cover the first capacitor plates of the first conductive layer. Next, a second conductive layer is applied to define a plurality of second capacitor plates opposed to respective of the first capacitor plates. An encapsulate material may also be applied over the layers on the substrate.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
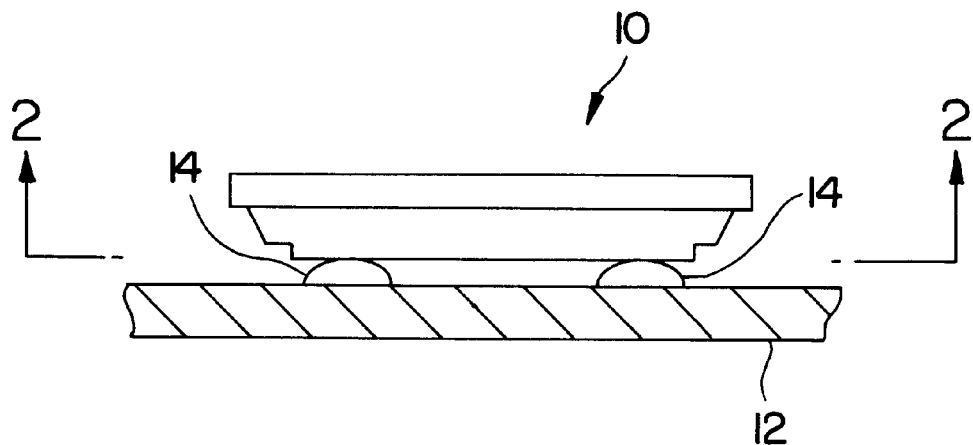
FIG. 1 is a side elevation of an ultra-small capacitor array of the present invention as mounted to a printed circuit board.

Repeat use of reference characters in the present specification and drawings is intended to represent same or analogous features or elements of the invention.

DETAILED DESCRIPTION OF PREFERRED EMBODIMENTS

It is to be understood by one of skill in the art that the present discussion is a description of exemplary embodiments only, and is not intended as limiting the broader aspects of the present invention, which broader aspects are embodied in the exemplary constructions.

FIG. 1 illustrates a miniature capacitor device 10 of the present invention surface mounted to a printed circuit board 12. As can be seen, device 10 is inverted so that terminal structures on its "top" are electrically connected to circuit traces of the circuit board 12. This electrical connection is typically supplied by solder bumps 14, which also function to maintain device 10 in its physical location on the board.

Figure 2:
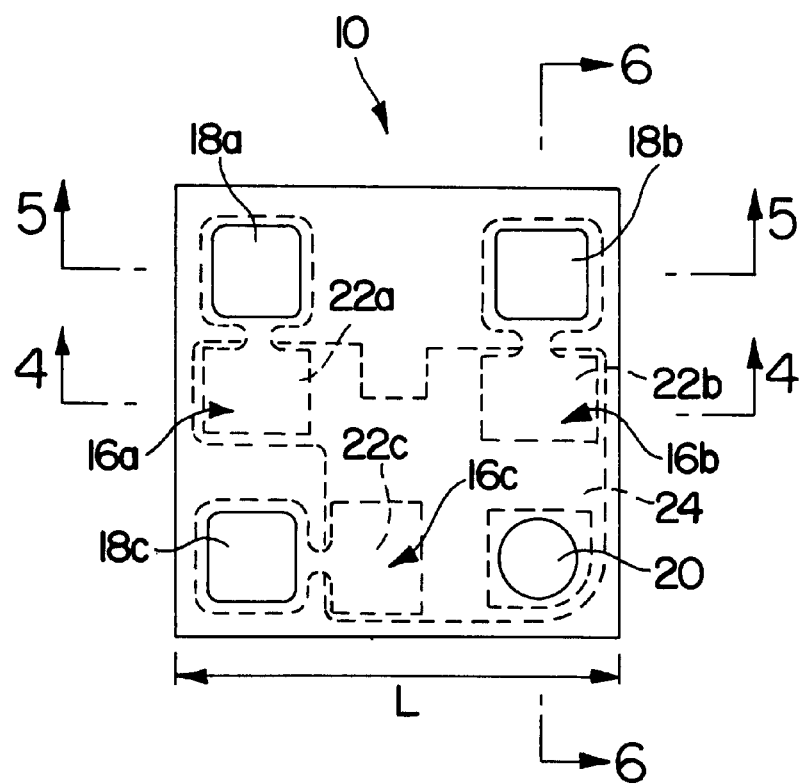
FIG. 2 is a plan view of the ultra-small capacitor array of FIG. 1 as taken along line 2—2.
Figure 3:
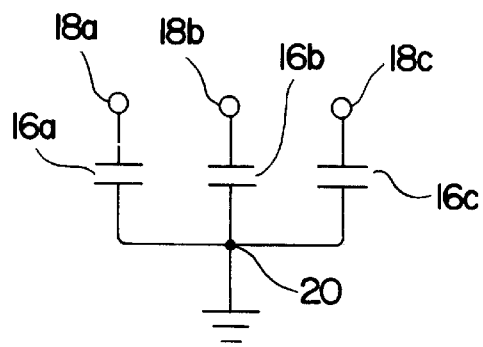
FIG. 3 is a schematic diagram of the circuit provided by the capacitor array of FIG. 2.

Referring now to FIG. 2, capacitor device 10 is configured in the illustrated embodiment as an integrated array having a plurality of individual capacitors. In particular, device 10 has three individual capacitors 16a, 16b and 16c. One plate of each capacitor is electrically connected to an associated terminal 18a, 18b, and 18c of a first polarity. A second plate of each capacitor is electrically connected to a common ground terminal 20. The equivalent circuit formed by the illustrated arrangement is depicted schematically in FIG. 3.

In this case, capacitors 16a, 16b and 16c are formed as thin film capacitors having a pair of opposed capacitor plates separated by a predetermined dielectric. Presently preferred embodiments utilize a high-K dielectric to achieve a relatively large capacitance value in a small package. For example, it will often be desirable to utilize a dielectric material exhibiting a dielectric constant of approximately 100 or more. A dielectric constant of greater than approximately 500 will often be preferred, with a dielectric constant of approximately 1100 being used in some exemplary embodiments.

Certain lead-based dielectrics, such as $Pb(Zr,Ti)O_3$ (referred to as PZT), are suitable for this purpose. The PZT may be doped with Nb, thereby yielding a PNZT material. Various aspects of PZT dielectrics are discussed in U.S. Pat. No. 5,625,529 to Lee, incorporated herein by reference.

The upper capacitor plate 22a, 22b and 22c of each opposed pair is formed by a respective conductive pattern formed above the dielectric. The lower capacitor plate of each opposed pair is formed by a conductive layer 24 located under the dielectric. Specifically, the portion of conductive layer 24 underlying each of the upper capacitor plates 22a, 22b and 22c forms the respective lower capacitor plate.

It can be seen that terminals 18a, 18b and 18c are formed as integral extensions of respective upper capacitor plates 22a, 22b and 22c. Conductive layer 24, on the other hand, integrally extends to ground terminal 20. This arrangement provides a structure in which the terminals are widely spaced near the corners of device 10. Such spacing may reduce the incidence of short circuits that may occur when device 10 is mounted to circuit board 12. In addition, the capacitors themselves are located adjacent to, instead of coincident with, the terminal structures. This reduces stress during device mounting that could otherwise damage a thin dielectric.

Despite the fact that device 10 will often have multiple capacitors of relatively large capacitance, the dimensions of device 10 will often be quite small. For example, it would not be unusual for the length L of device 10 to measure less than about 55 mil. In one exemplary embodiment, each side of device 10 may measure only about 40 mil.

Figure 4:
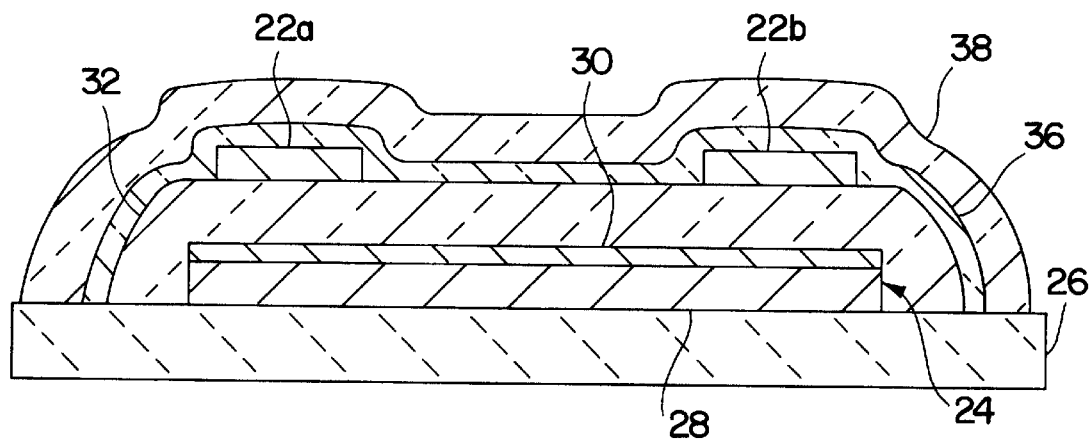
FIG. 4 is a cross-sectional view as taken along line 4—4 of FIG. 2.
Figure 5:
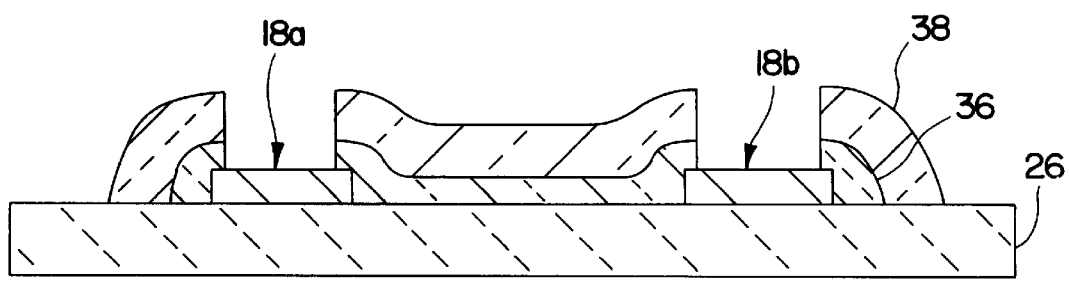
FIG. 5 is a cross-sectional view as taken along line 5—5 of FIG. 2.
Figure 6:
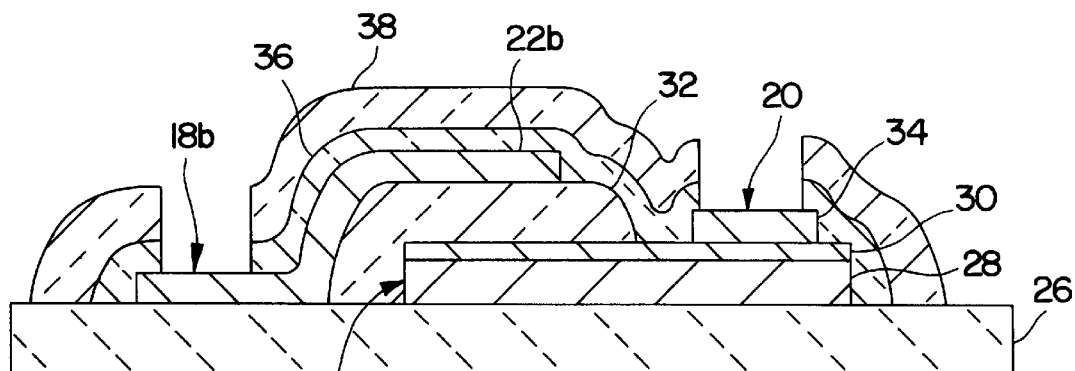
FIG. 6 is a cross-sectional view as taken along line 6—6 of FIG. 2.

The various layers in device 10 can be most easily explained with reference to FIGS. 4 through 6. Lower conductive layer 26 is located on the top surface of a suitable substrate 26, such as silicon, glass or $Al_2O_3$. Particularly where a PZT dielectric is utilized, conductive layer 24 may be constructed having a metallic layer 28 of a highly conductive metal and an oxide layer 30 of a material adapted to collect oxygen vacancies in the dielectric. One suitable oxide material that may be utilized for this purpose is lanthanum strontium cobalt oxide (LSCO).

Dielectric layer 32 is located above lower conductive layer 24, at least in regions where upper capacitor plates 22a, 22b and 22c will be applied. As noted above, terminals 18a, 18b and 18c are formed as integral extensions of the upper capacitor plates. A conductive layer 34, formed in the same manner as the upper capacitor plates and their associated terminals, may be optionally located on lower conductive layer 24 at ground terminal 20.

The various layers located on substrate 26 may be protected by a suitable encapsulate. In presently preferred embodiments, the encapsulate may comprise a primary passivation layer 36 of SiN or the like. A secondary passivation layer 38 of a suitable polymer material may also be provided. One such polymer material that may be utilized for this purpose is benzocyclobutene (BCB). The use of BCB as a polymer coating to a primary passivation layer is discussed in A. J. G. Strandjord et al., "Photosensitive Benzocyclobutene for Stress-Buffer and Passivation Applications (One Mask Manufacturing Process)", 1997 Electronic Components and Technology Conference, incorporated herein by reference. As shown, the encapsulate is patterned to expose the various terminals of device 10.

Figure 7A:
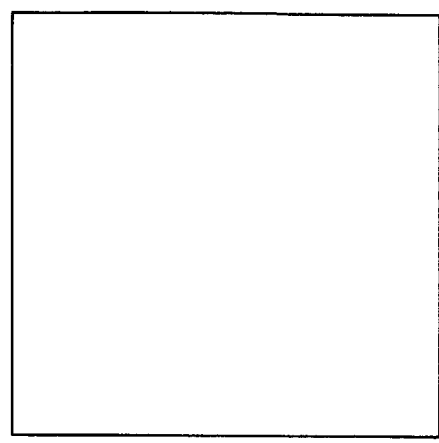
FIGS. 7A through 7E illustrate successive steps in the manufacture of a capacitor array as in FIG. 2.
Figure 7B:
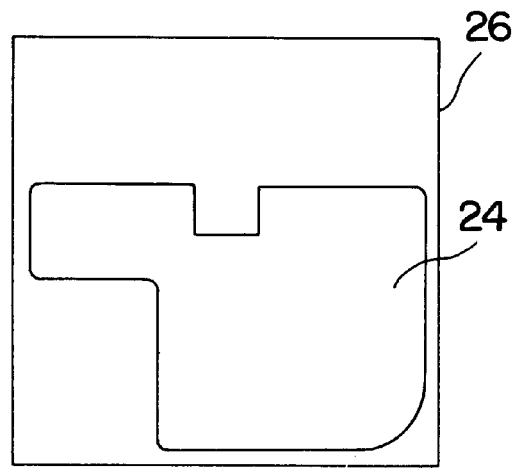

FIGS. 7A through 7E illustrate various steps employed in the manufacture of device 10. Referring first to FIG. 7A, substrate 26 is illustrated prior to the application of any layers. It will be appreciated that the length and width of device 10 will generally be defined by the size of substrate 26. Next, as shown in FIG. 7B, lower conductive layer 24 is applied to the top surface of substrate 26. In exemplary embodiments, lower conductive layer 24 may be a layer of platinum metallization that has been patterned according to conventional processing techniques.

Figure 7C:
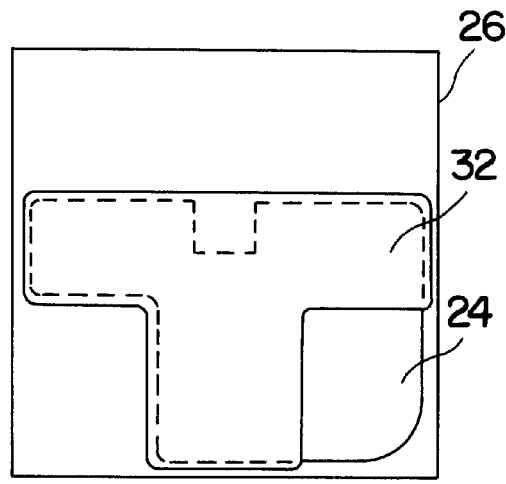

FIG. 7C illustrates dielectric layer 32 applied to cover a selected portion of lower conductive layer 24. As described above, dielectric layer 32 is preferably a lead-based dielectric having a relatively high dielectric constant. According to preferred methodology, the dielectric is applied by a sol-gel coating process and subsequently patterned as desired.

A sol-gel process that applies relatively thick coating cycles is particularly preferred to achieve a given layer thickness with a fewer coats. For example, a 1,3-propanediol-based PZT solution synthesis may be utilized to apply PZT films having a thickness of 0.4–0.5µm per spin casting cycle. As such, only two coats may be necessary to achieve desired thickness levels of about 0.8–1.0µm. This is in comparison with many conventional sol-gel techniques which may only achieve a thickness of about 0.1µm with each coating cycle. A more detailed description of a sol-gel coating process that may be utilized herein is given in Liu et al., "Thick Layer Deposition of Lead Perovskites Using Diol-Based Chemical Solution Approach," Integrated Ferroelectrics, 1997, Vol. 18, pp. 263–274, incorporated herein by reference.

Figure 7D:
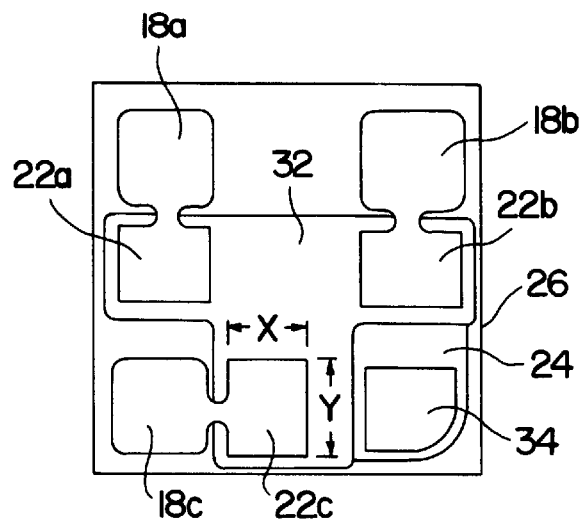

Referring now to FIG. 7D, a patterned second conductive layer provides terminals 18a, 18b and 18c as well as upper capacitor plates 22a, 22b and 22c. As described above, a conductive layer 34 may also be optionally provided in direct contact with lower conductive layer 24. A Cr/Ni plus Ag,Pd layer applied by typical processing techniques, such as by sputtering, is suitable for this second conductive layer.

Figure 7E:
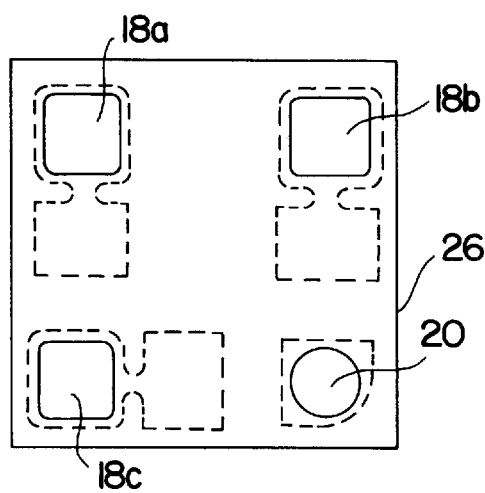
Figure 8A:
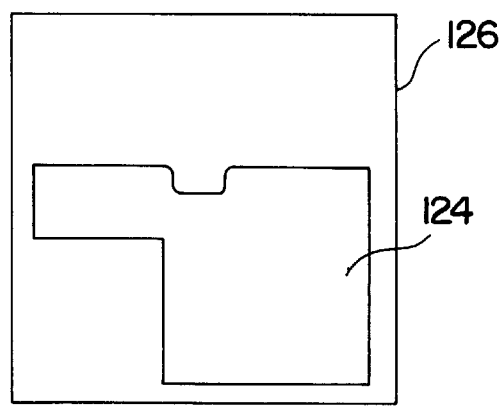
FIGS. 8A through 8D illustrate successive steps in the manufacture of a first alternative capacitor array.
Figure 8B:
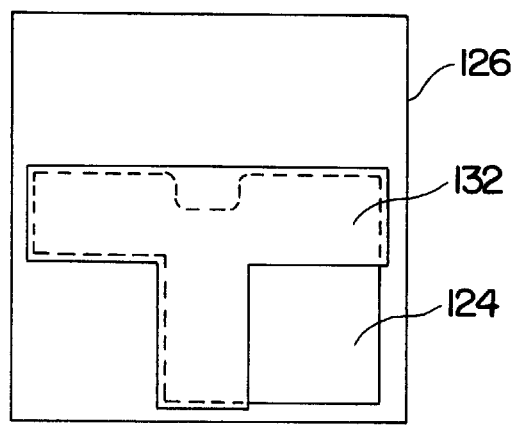
Figure 8C:
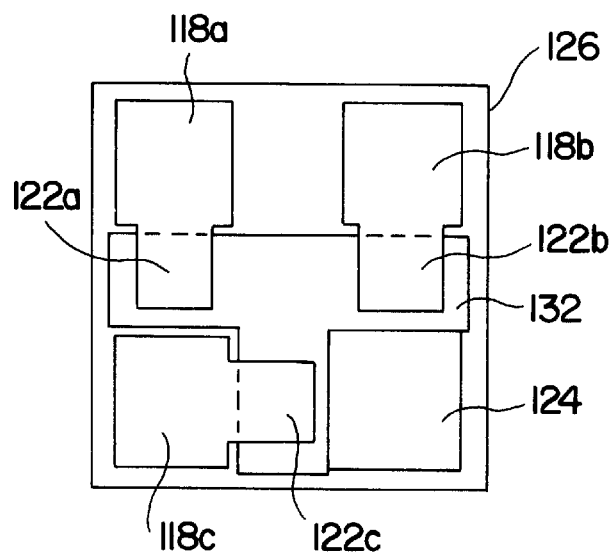
Figure 8D:
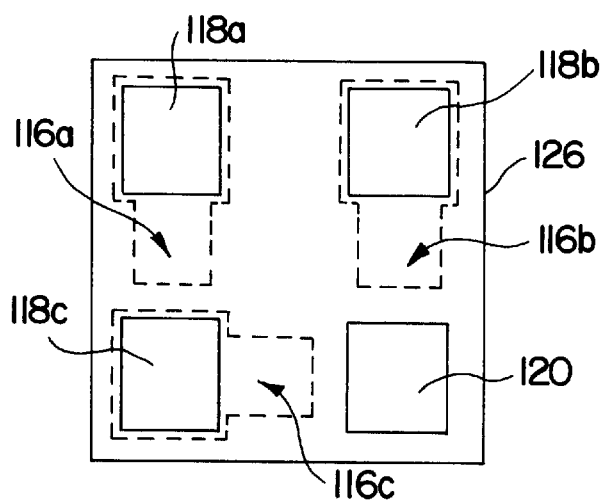
Figure 9A:
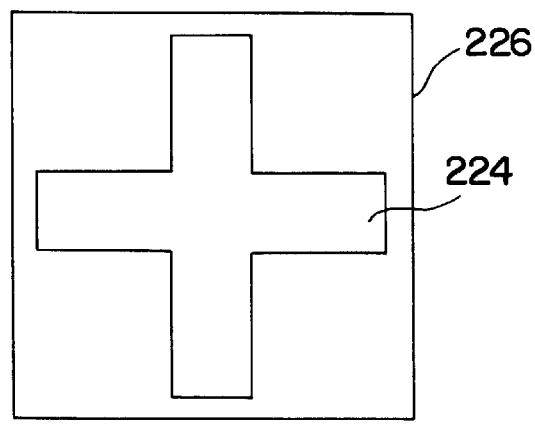
FIGS. 9A through 9D illustrate successive steps in the manufacture of a second alternative capacitor array.
Figure 9B:
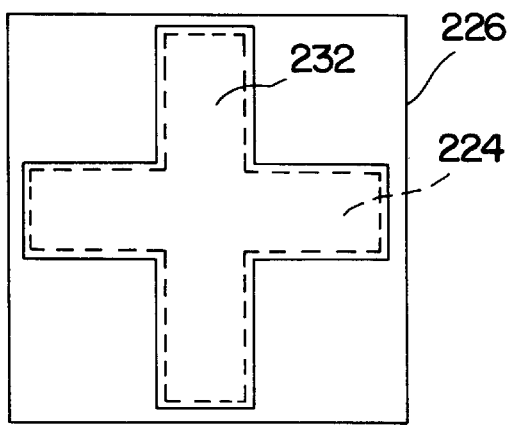
Figure 9C:
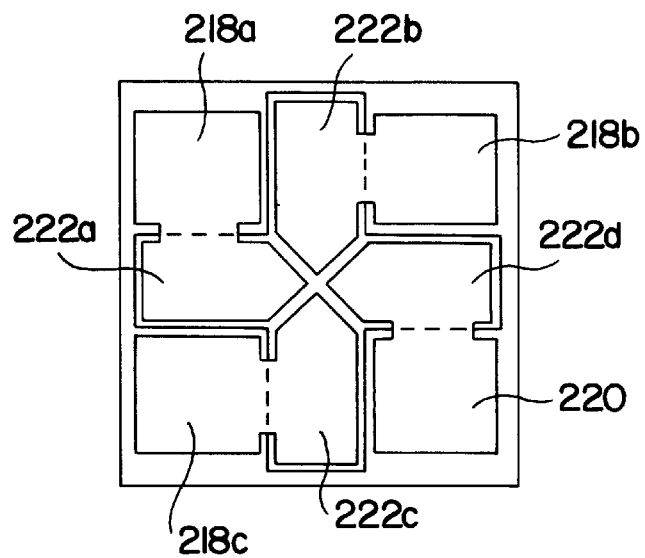
Figure 9D:
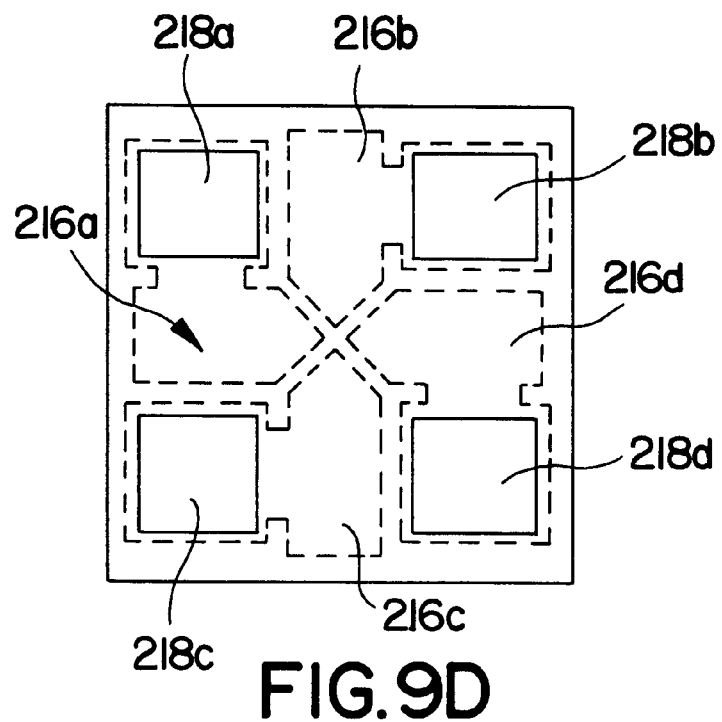

The various layers formed on substrate 26 are then encapsulated as shown in FIG. 7E. The encapsulate material is patterned, such as by etching, to expose the terminal structures.

The use of a dielectric having a high dielectric constant in devices of the present invention allows a large capacitance to be achieved in a small plate area (X times Y). In fact, exemplary embodiments of the invention may exhibit a capacitance of about 14 nanofarad/mil$^2$ or more. As an example, each capacitor of device 10 may have a plate area of about 175 mil$^2$ or less. In one exemplary embodiment, the plate area (X times Y) of each capacitor may be only about 100 mil$^2$ while having a capacitance value of 560 picofarads or more.

FIGS. 8A through 8D illustrate the manufacture of an alternative three-capacitor array according to the present invention. For the sake of simplicity, the steps involved in producing this device will not be described in detail. Steps or elements analogous to similar steps or elements in device 10 are represented by a reference number augmented by one-hundred.

Figure 10:
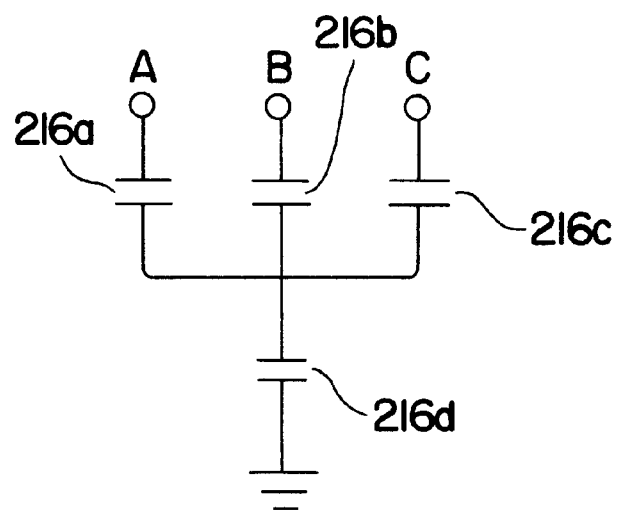
FIG. 10 is a schematic diagram of the circuit provided by the capacitor array produced as shown in FIGS. 9A through 9D.

The manufacture of a further alternative is illustrated in FIGS. 9A through 9D. Similarly, steps or elements analogous to those of device 10 are represented by a reference number augmented by two-hundred. In this embodiment, any of the four terminals can be used as a common terminal for the other three. This is schematically illustrated in FIG. 10.

It can be seen that the present invention provides integrated capacitor arrays having the simultaneous advantages of being very small while providing relatively large capacitance values at each capacitor. The preferred embodiments described above utilize integrated circuit fabrication techniques to integrate ferroelectric materials in a surface mountable electronic device. One of skill in the art will appreciate that variations and modifications may be made without departing from the invention. In addition, aspects of the various embodiments may be interchanged both in whole or in part. Furthermore, those of ordinary skill in the art will appreciate that the foregoing description is by way of example only, and is not intended to be limitative of the invention so further described in such appended claims.

What is claimed is:

1. A miniature capacitor device, said device comprising:
   a substrate being located on a side of said device opposite a surface to which said device is mounted;
   a first conductive layer disposed on said substrate, said first conductive layer defining at least three first capacitor plates each having a respective first terminal structure adjacent thereto;
   a dielectric layer disposed on said at least three first capacitor plates;
   a second conductive layer defining at least three second capacitor plates each having a respective second terminal structure adjacent thereto, each of said second capacitor plates being disposed on said dielectric layer in opposition to a respective of said first capacitor plates.

2. A miniature capacitor device as set forth in claim 1, further comprising an encapsulate material disposed over said layers on said substrate, said encapsulate material defined to expose said first and second terminal structures.

3. A miniature capacitor device, said device comprising:
   a substrate being located on a side of said device opposite a surface to which said device is mounted;
   a first conductive layer disposed on said substrate, said first conductive layer defining at least one first capacitor plate and a first terminal structure adjacent thereto;
   a dielectric layer disposed on said first capacitor plate;
   a second conductive layer defining at least one second capacitor plate and a second terminal structure positioned beside second capacitor plate at a location adjacent thereto, said second capacitor plate being disposed on said dielectric layer in opposition to said first capacitor plate; and
   wherein said substrate is selected from a group consisting of silicon, glass or $Al_2O_3$.

4. A miniature capacitor array having a plurality of capacitor devices in a single package, said array comprising:
   a substrate;
   a first conductive layer disposed on said substrate, said first conductive layer defining a plurality of first capacitor plates;
   a dielectric layer disposed on said plurality of first capacitor plates;
   a second conductive layer defining a plurality of second capacitor plates disposed on said dielectric layer in opposition to respective of said first capacitor plates, said second conductive layer further defining respective terminal structures adjacent to each of said second capacitor plates; and
   an encapsulate material disposed over said layers on said substrate, said encapsulate material defined to expose said terminal structures.

5. A miniature capacitor device as set forth in claim 4, wherein said first conductive layer comprises at least three first capacitor plates and said second conductive layer comprises at least three second capacitor plates respectively opposed thereto.

6. A miniature capacitor array as set forth in claim 4, wherein said first conductive layer is a continuous conductive layer in which said plurality of capacitor plates comprise integral portions thereof.

7. A miniature capacitor array as set forth in claim 6, wherein said first conductive layer defines a common terminal structure as a further integral portion thereof.

8. A miniature capacitor array as set forth in claim 4, wherein said dielectric material comprises a lead-based dielectric material having a dielectric constant of at least about 500.

9. A miniature capacitor array as set forth in claim 8, wherein said lead-based dielectric material comprises a PZT dielectric material.

10. A miniature capacitor array having a plurality of capacitor devices in a single package, said array comprising:
   a substrate having a top surface, said top surface of said substrate having an area of no greater than approximately 175 square mils;
   a first conductive layer disposed on said substrate, said first conductive layer defining at least three first capacitor plates;
   a dielectric layer disposed on said plurality of first capacitor plates; and
   a second conductive layer defining at least three second capacitor plates disposed on said dielectric layer in opposition to respective of said first capacitor plates, said second conductive layer further defining respective terminal structures adjacent to each of said second capacitor plates.

11. A miniature capacitor array as set forth in claim 10, wherein each of said plurality of capacitor devices is located between a respective pair of said terminal structures.

12. A miniature capacitor array as set forth in claim 10, wherein each of said capacitor devices has a capacitance of at least approximately 560 pf.

13. A miniature capacitor array having a plurality of capacitor devices in a single package, said array comprising:
   a substrate;
   a first conductive layer disposed on said substrate, said first conductive layer defining a plurality of first capacitor plates;
   a dielectric layer disposed on said plurality of first capacitor plates, said dielectric layer comprising a lead-based dielectric material having a dielectric constant of at least about 500 and further having a thickness of no greater than approximately 1.0 $\mu$m; and
   a second conductive layer defining a plurality of second capacitor plates disposed on said dielectric layer in opposition to respective of said first capacitor plates, said second conductive layer further defining respective terminal structures adjacent to each of said second capacitor plates.

\* \* \* \* \*